United States Patent
Kim et al.

(10) Patent No.: US 11,011,214 B2
(45) Date of Patent: May 18, 2021

(54) DATA RECEIVING CIRCUIT

(71) Applicants: SK hynix Inc., Gyeonggi-do (KR); Seoul National University R&DB Foundation, Seoul (KR)

(72) Inventors: Suhwan Kim, Seoul (KR); Deog-Kyoon Jeong, Seoul (KR); Sang-Yoon Lee, Seoul (KR); Joo-Hyung Chae, Seoul (KR); Chang-Ho Hyun, Seoul (KR)

(73) Assignees: SK hynix Inc., Gyeonggi-do (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/582,322

(22) Filed: Sep. 25, 2019

(65) Prior Publication Data
US 2020/0105323 A1   Apr. 2, 2020

(30) Foreign Application Priority Data
Sep. 28, 2018   (KR) .................. 10-2018-0116442

(51) Int. Cl.
*G11C 7/00* (2006.01)
*G11C 7/22* (2006.01)
*H03K 5/135* (2006.01)
*H03K 5/00* (2006.01)

(52) U.S. Cl.
CPC ............. *G11C 7/222* (2013.01); *H03K 5/135* (2013.01); *H03K 2005/00019* (2013.01); *H03K 2005/00286* (2013.01)

(58) Field of Classification Search
CPC ........................................................ G11C 8/18
USPC ........................................................ 365/193
See application file for complete search history.

(56) References Cited

U.S. PATENT DOCUMENTS

2012/0063524 A1* 3/2012 Stott .................... G11C 7/1096
375/259

FOREIGN PATENT DOCUMENTS

KR   10-1448919   10/2014

* cited by examiner

*Primary Examiner* — Hoai V Ho
(74) *Attorney, Agent, or Firm* — IP & T Group LLP

(57) ABSTRACT

A data receiving circuit may include: a variable delay circuit suitable for generating a delayed strobe signal by delaying a strobe signal; a receiving circuit suitable for sampling data in synchronization with the delayed strobe signal; a phase shift circuit suitable for generating a shifted strobe signal by shifting a phase of the delayed strobe signal; a phase comparison circuit suitable for comparing phases of the data and the shifted strobe signal; and a delay adjusting circuit suitable for adjusting a delay value of the variable delay circuit in response to the phase comparison result of the phase comparison circuit.

6 Claims, 4 Drawing Sheets

DATA RECEIVING CIRCUIT

CROSS-REFERENCE TO RELATED APPLICATION

This application claims priority under 35 U.S.C. § 119 to Korean Patent Application No. 10-2018-0116442, filed on Sep. 28, 2018, which is incorporated herein by reference in its entirety.

BACKGROUND

1. Field

Various embodiments of the present invention relate to a data receiving circuit which receives data using a strobe signal.

2. Discussion of the Related Art

In order for integrated circuit chips to exchange data with each other at high speed, the integrated circuit chips require a signal used for correctly recognizing data, that is, a strobe signal. Therefore, when exchanging the data at high speed, the integrated circuit chips exchange the strobe signal as well.

As a representative example, almost all kinds of memory devices exchange a strobe signal for strobing data, when exchanging the data with each other. For stability of data transfer/reception, the data and the strobe signal need to be correctly aligned. FIG. 1 illustrates that edges of a strobe signal DQS are aligned with the centers of data DQ. For the alignment between the data DQ and the strobe signal DQS in FIG. 1, a training process between a memory device and a memory controller is performed during a reset process of the memory device. However, as time elapses after the training process, the alignment may be distorted by process, voltage, and temperature (PVT) variation or the like. Therefore, there is a demand for a technique for correcting the distorted alignment between the data and the strobe signal after the training process or recovering the alignment of the training process.

SUMMARY

Various embodiments are directed to a technique for aligning data and a strobe signal.

In an embodiment, a data receiving circuit may include: a variable delay circuit suitable for generating a delayed strobe signal by delaying a strobe signal; a receiving circuit suitable for sampling data in synchronization with the delayed strobe signal; a phase shift circuit suitable for generating a shifted strobe signal by shifting a phase of the delayed strobe signal; a phase comparison circuit suitable for comparing phases of the data and the shifted strobe signal; and a delay adjusting circuit suitable for adjusting a delay value of the variable delay circuit in response to the phase comparison result of the phase comparison circuit.

In an embodiment, a data receiving circuit may include: a variable delay circuit suitable for generating a delayed strobe signal by delaying a strobe signal; a receiving circuit suitable for sampling data in synchronization with the delayed strobe signal; a frequency multiplier circuit suitable for generating a high-frequency strobe signal having a frequency twice as high as that of the delayed strobe signal; a sampling circuit suitable for sampling the high-frequency strobe signal in synchronization with the data; and a delay adjusting circuit suitable for adjusting a delay value of the variable delay circuit in response to the sampling result of the sampling circuit.

In an embodiment, a data receiving circuit may include: a variable delay circuit suitable for receiving a strobe signal and delaying the strobe signal by a variable delay value to generate a delayed strobe signal; a receiving circuit suitable for receiving data and sampling the data in synchronization with the delayed strobe signal; a phase comparison circuit suitable for detecting a phase difference between the data and a shifted strobe signal, which is generated by shifting a phase of the delayed strobe signal; and a delay adjusting circuit, which operates in synchronization with delayed data generated by delaying the data, suitable for adjusting the variable delay value based on the detected phase difference.

DETAILED DESCRIPTION

Figure 1:
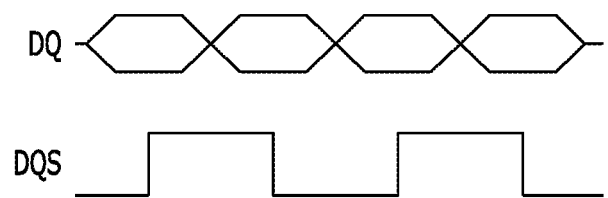
FIG. 1 illustrates that edges of a strobe signal are aligned with the centers of data.

Various embodiments are described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Figure 2:
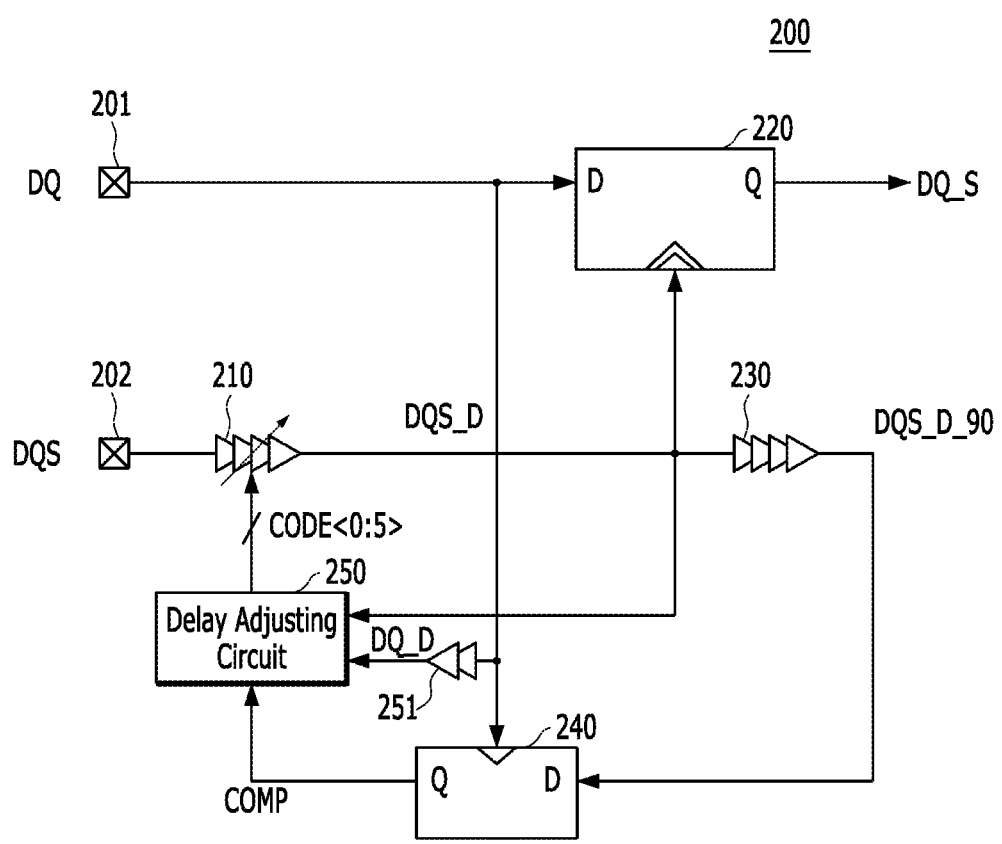
FIG. 2 is a diagram of a data receiving circuit in accordance with an embodiment.

FIG. 2 is a diagram of a data receiving circuit 200 in accordance with an embodiment.

Referring to FIG. 2, the data receiving circuit 200 may include a variable delay circuit 210, a receiving circuit 220, a phase shift circuit 230, a phase comparison circuit 240 and a delay adjusting circuit 250.

The variable delay circuit 210 may generate a delayed strobe signal DQS_D by delaying a strobe signal DQS received through a strobe pad 202. The variable delay circuit 210 may have a delay value which is adjusted according to a delay code CODE<0:5>. In the present embodiment, the delay code CODE<0:5> may have six bits. However, the present invention is not limited to any particular length of delay code. Rather, the delay code may have any suitable number of bits.

The receiving circuit 220 may receive data DQ through a data pad 201 and sample the data DQ in synchronization with the delayed strobe signal DQS_D. Specifically, the receiving circuit 220 may sample the data DQ at rising and falling edges of the delayed strobe signal DQS_D, and output the sampled data DQ_S. The receiving circuit 220 may include a dual edge-type D flip-flop which receives the data DQ through an input terminal (D) thereof, receives the delayed strobe signal DQS_D through a clock terminal thereof, and outputs the sampled data DQ_S through an output terminal (Q) thereof.

The phase shift circuit 230 may generate a shifted strobe signal DQS_D_90 by shifting the phase of the delayed strobe signal DQS_D by a certain degree, e.g., 90 degrees. The phase shift circuit 230 may include a delay circuit having a delay value corresponding to a portion, e.g., ¼, of one cycle of the strobe signal DQS.

The phase comparison circuit 240 may compare the phases of the data DQ with the shifted strobe signal DQS_D_90. The phase comparison circuit 240 may sample the shifted strobe signal DQS_D_90 in synchronization with the data DQ. Specifically, the phase comparison circuit 240 may sample the shifted strobe signal DQS_D_90 at a select, e.g., rising, edge of the data DQ. The phase comparison circuit 240 may include a rising edge-type D flip-flop which receives the shifted strobe signal DQS_D_90 through an input terminal (D) thereof, receives the data DQ through a clock terminal thereof, and outputs the phase comparison result COMP through an output terminal (Q) thereof.

The delay adjusting circuit 250 may adjust the delay value of the variable delay circuit 210 in response to the phase comparison result COMP and the delayed strobe signal DQS_D. Based on the levels of the phase comparison result COMP and the delayed strobe signal DQS_D, it is possible to determine which one of the shifted strobe signal DQS_D_90 and the data DQ leads the other. When the delay value of the variable delay circuit 210, i.e., the value of the delay code CODE<0:5> is adjusted according to the determination result, the rising and falling edges of the delayed strobe signal DQS_D may be aligned with the centers of the data DQ. Table 1 below summarizes the operation of the delay adjusting circuit 250.

Referring to Table 1, the operation of the delay adjusting circuit 250 can be clearly understood.

TABLE 1

| DQS_D | COMP | Meaning | CODE<0:5> |
|---|---|---|---|
| H | H | DQS_D_90 leads DQ, and delay value of variable delay circuit needs to be increased | +1 |
|  | L | DQS_D_90 lags behind DQ, and delay value of variable delay circuit needs to be decreased | −1 |
| H | H | DQS_D_90 lags behind DQ, and delay value of variable delay circuit needs to be decreased | −1 |
|  | L | DQS_D_90 leads DQ, and delay value of variable delay circuit needs to be increased | +1 |

The delay adjusting circuit 250 may operate in synchronization with delayed data DQ_D, i.e., data DQ that has been delayed by a delay circuit 251. That is, the delay adjusting circuit 250 may update the delay code CODE<0:5> after a set time has elapsed from a rising edge of the data DQ or specifically a time corresponding to the delay value of the delay circuit 251 has elapsed.

Figure 3:
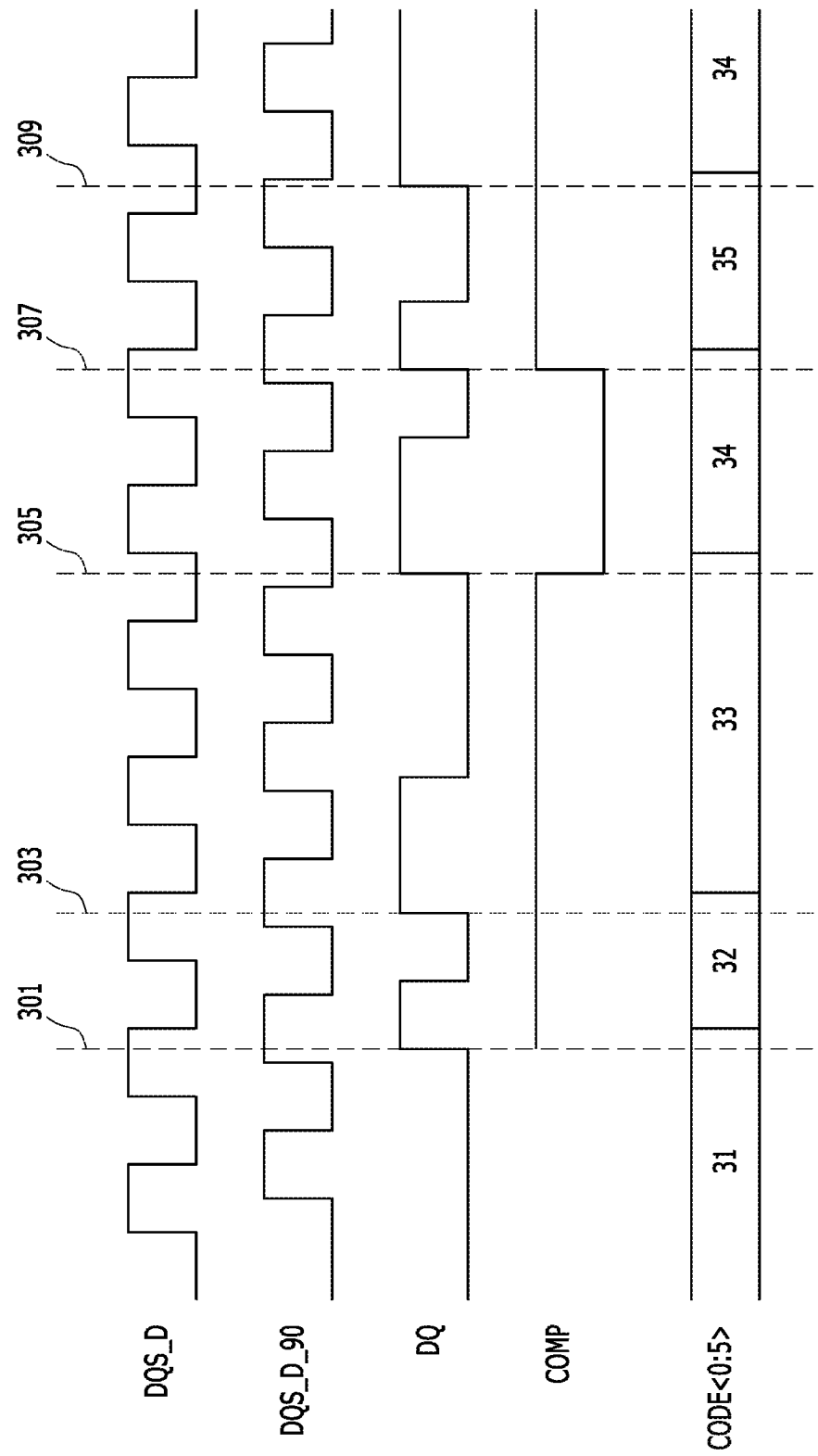
FIG. 3 is a timing diagram illustrating an operation of the data receiving circuit of FIG. 2.

FIG. 3 is a timing diagram illustrating an operation of the data receiving circuit 200 of FIG. 2.

By way of example, FIG. 3 illustrates that the data DQ has a pattern of (L, L, L, H, L, H, H, L, L, L, H, H, L, H, L, L, H, H), where 'L' and 'H' represent logic low and logic high levels respectively.

Referring to FIG. 3, at time '301' that the data DQ transitions from logic low level L to logic high level H, that is, at a rising edge of the data DQ, the phase comparison circuit 240 may generate the phase comparison result COMP as logic high level H by sampling the shifted strobe signal DQS_D_90. Since the level of the delayed strobe signal DQS_D at time '301' is logic high level H, the delay adjusting circuit 250 may adjust the value of the delay code CODE<0:5> from 31 to 32, or increase the value of the delay code CODE<0:5> by +1.

At time '303' corresponding to the next rising edge of the data DQ, the phase comparison result COMP has logic high level H, and the level of the delayed strobe signal DQS_D is logic high level H. Therefore, the delay adjusting circuit 250 may adjust the value of the delay code CODE<0:5> from 32 to 33, or increase the value of the delay code CODE<0:5> by +1.

At time '305' corresponding to the next rising edge of the data DQ, the phase comparison result COMP has logic low level L and the level of the delayed strobe signal DQS_D is logic low level L. Therefore, the delay adjusting circuit 250 may adjust the value of the delay code CODE<0:5> from 33 to 34, or increase the value of the delay code CODE<0:5> by +1.

At time '307' corresponding to the next rising edge of the data DQ, the phase comparison result COMP has logic high level H and the level of the delayed strobe signal DQS_D is logic high level H. Therefore, the delay adjusting circuit 250 may adjust the value of the delay code CODE<0:5> from 34 to 35, or increase the value of the delay code CODE<0:5> by +1.

At time '309' corresponding to the next rising edge of the data DQ, the phase comparison result COMP has logic high level H and the level of the delayed strobe signal DQS_D is logic low level L. Therefore, the delay adjusting circuit 250 may adjust the value of the delay code CODE<0:5> from 35 to 34, or decrease the value of the delay code CODE<0:5> by −1.

Through such an operation, the rising and falling edges of the delayed strobe signal DQS_D may be aligned with the centers of the data DQ. As a result, the receiving circuit 220 may receive the data DQ in synchronization with the delayed strobe signal DQS_D with the optimal margin.

Figure 4:
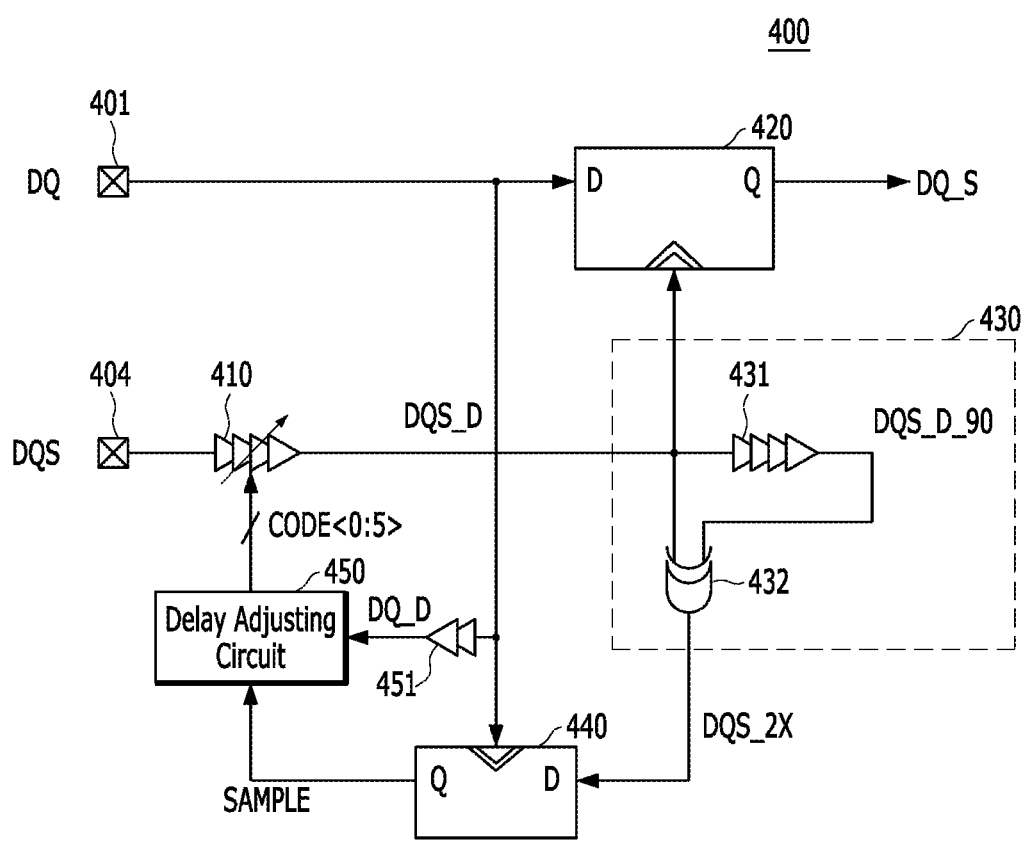
FIG. 4 is a diagram of a data receiving circuit in accordance with another embodiment.

FIG. 4 is a diagram of a data receiving circuit 400 in accordance with another embodiment.

Referring to FIG. 4, the data receiving circuit 400 may include a variable delay circuit 410, a receiving circuit 420, a frequency multiplier circuit 430, a sampling circuit 440 and a delay adjusting circuit 450.

The variable delay circuit 410 may generate a delayed strobe signal DQS_D by delaying a strobe signal DQS received through a strobe pad 402. The variable delay circuit 410 may have a delay value which is adjusted according to a delay code CODE<0:5>. In the present embodiment, the delay code CODE<0:5> may have six bits. However, as previously noted in connection with FIG. 2, the invention is not so limited; the delay code may have any suitable number of bits.

The receiving circuit 420 may receive data DQ through a data pad 401 and sample the data DQ in synchronization with the delayed strobe signal DQS_D. Specifically, the receiving circuit 420 may sample the data DQ at rising and falling edges of the delayed strobe signal DQS_D, and output the sampled data DQ_S. The receiving circuit 420 may include a dual edge-type D flip-flop which receives the data DQ through an input terminal (D) thereof, receives the delayed strobe signal DQS_D through a clock terminal thereof, and outputs the sampled data DQ_S through an output terminal (Q) thereof.

The frequency multiplier circuit 430 may generate a high-frequency strobe signal DQS_2X having a frequency twice as high as that of the delayed strobe signal DQS_D. The frequency multiplier circuit 430 may include a phase shift circuit 431 and an XOR gate 432. The phase shift circuit 431 may generate a shifted strobe signal DQS_D_90 by shifting the phase of the delayed strobe signal DQS_D by certain degree, e.g., 90 degrees. The phase shift circuit 431 may include a delay circuit having a delay value corresponding to a portion, e.g., ¼, of one cycle of the strobe signal DQS. The XOR gate 432 may receive the delayed strobe signal DQS_D and the shifted strobe signal DQS_D_90, and output the high-frequency strobe signal DQS_2X.

The sampling circuit 440 may sample the high-frequency strobe signal DQS_2X in synchronization with the data DQ. Specifically, the sampling circuit 440 may sample the high-frequency strobe signal DQS_2X at rising and falling edges of the data DQ, and output the sampling result. The sampling circuit 440 may includes a dual edge-type D flip-flop which receives the high-frequency strobe signal DQS_2X through an input terminal (D) thereof, receives the data DQ through a clock terminal thereof, and outputs the sampling result SAMPLE through an output terminal (Q) thereof.

The delay adjusting circuit 450 may adjust the delay value of the variable delay circuit 410, i.e., the value of the delay code CODE<0:5> in response to the sampling result SAMPLE. The delay adjusting circuit 450 may decrease the delay value of the variable delay circuit 410 when the sampling result SAMPLE has a logic high level H, and increase the delay value of the variable delay circuit 410 when the sampling result SAMPLE has a logic low level L. Table 2 below summarizes the operation of the delay adjusting circuit 450. Referring to Table 2, the operation of the delay adjusting circuit 450 can be clearly understood.

TABLE 2

| SAMPLE | Meaning | CODE<0:5> |
|---|---|---|
| H | DQS_D_90 lags behind DQ, and delay value of variable delay circuit needs to be decreased | −1 |
| L | DQS_D_90 leads DQ, and delay value of variable delay circuit needs to be increased | +1 |

The delay adjusting circuit 450 may operate in synchronization with delayed data DQ_D, i.e., data DQ that has been delayed by the delay circuit 451. That is, the delay adjusting circuit 450 may update the delay code CODE<0:5> after a set time has elapsed from a rising or falling edge of the data DQ or specifically a time corresponding to the delay value of the delay circuit 451 has elapsed.

Figure 5:
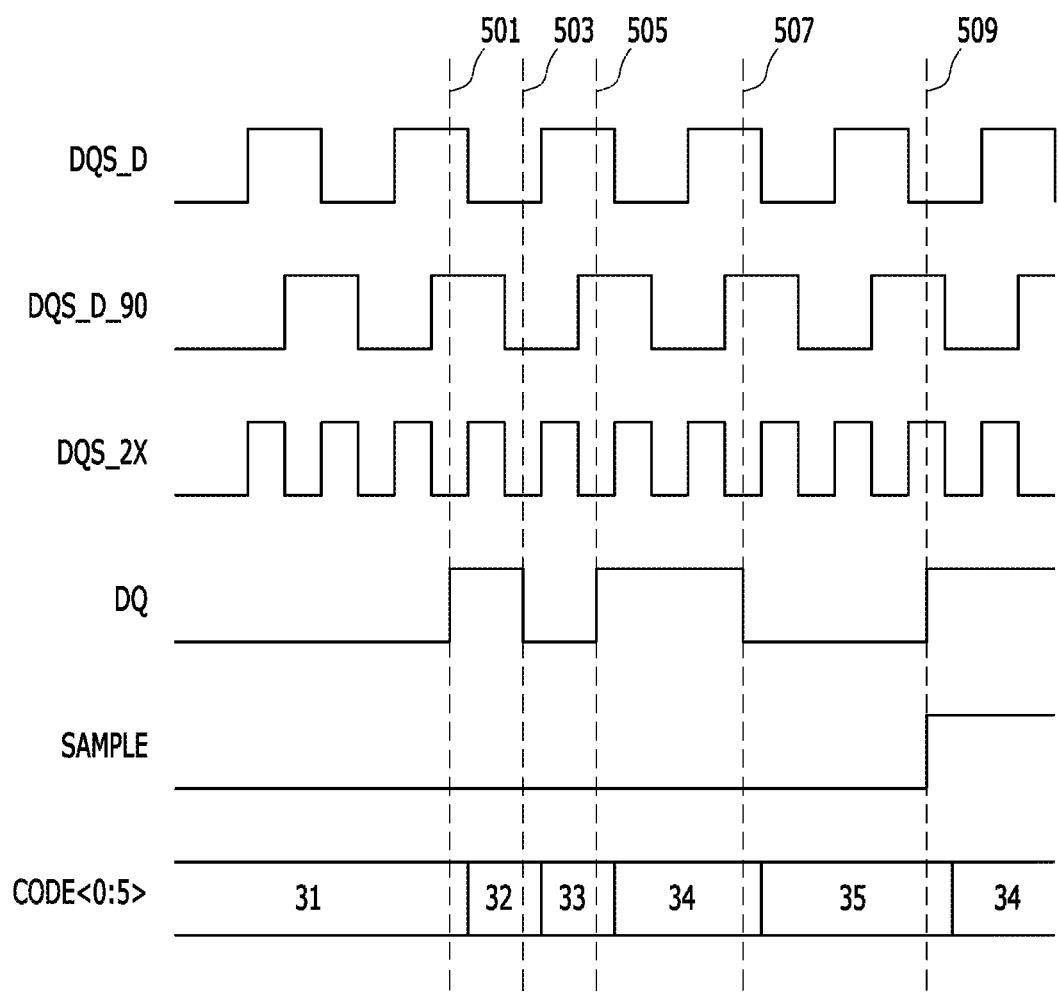
FIG. 5 is a timing diagram illustrating an operation of the data receiving circuit of FIG. 4.

FIG. 5 is a timing diagram illustrating an operation of the data receiving circuit 400 of FIG. 4.

By way of example, FIG. 5 illustrates that the data DQ has a pattern of (L, L, L, H, L, H, H, L, L, L, H, H), where, as in FIG. 3, 'L' and 'H' represent logic low and logic high levels respectively.

Referring to FIG. 5, at time '501' that the data DQ transitions from a logic low level L to a logic high level H, that is, at a rising edge of the data DQ, the sampling circuit 440 may generate the sampling result SAMPLE as logic low level L by sampling the high-frequency strobe signal DQS_2X. The delay adjusting circuit 450 may adjust the value of the delay code CODE<0:5> from 31 to 32 or increase the value by "+1", in response to the sampling result SAMPLE.

At time '503' that the data DQ transitions from logic high level H to logic low level L, that is, at a falling edge of the data DQ, the sampling circuit 440 may generate the sampling result SAMPLE as logic low level L by sampling the high-frequency strobe signal DQS_2X. The delay adjusting circuit 450 may adjust the value of the delay code CODE<0:5> from 32 to 33 or increase the value by +1, in response to the sampling result SAMPLE.

At time '505' that the data DQ transitions from logic low level L to logic high level H, that is, at a rising edge of the data DQ, the sampling circuit 440 may generate the sampling result SAMPLE as logic low level L by sampling the high-frequency strobe signal DQS_2X. The delay adjusting circuit 450 may adjust the value of the delay code CODE<0:5> from 33 to 34 or increase the value by "+1", in response to the sampling result SAMPLE.

At time '507' that the data DQ transitions from logic high level H to logic low level L, that is, at a falling edge of the data DQ, the sampling circuit 440 may generate the sampling result SAMPLE as logic low level L by sampling the high-frequency strobe signal DQS_2X. The delay adjusting circuit 450 may adjust the value of the delay code CODE<0:5> from 34 to 35 or increase the value by +1, in response to the sampling result SAMPLE.

At time '509' that the data DQ transitions from logic low level L to logic high level H, that is, at a rising edge of the data DQ, the sampling circuit 440 may generate the sampling result SAMPLE as logic high level H by sampling the high-frequency strobe signal DQS_2X. The delay adjusting circuit 450 may adjust the value of the delay code CODE<0:5> from 35 to 34 or decrease the value by −1, in response to the sampling result SAMPLE.

Through such an operation, the rising and falling edges of the delayed strobe signal DQS_D may be aligned with the centers of the data DQ. As a result, the receiving circuit 420 may receive the data DQ in synchronization with the delayed strobe signal DQS_D having the optimal margin. Since the data receiving circuit 400 of FIG. 4 adjusts the delay value of the delayed strobe signal DQS_D at both of the rising and falling edges of the data DQ, the data receiving circuit 400 is configured to align the rising and falling edges of the delayed strobe signal DQS_D with the centers of the data DQ faster than the data receiving circuit 200 of FIG. 2.

In accordance with embodiments, the data and the strobe signal are aligned with each other.

Although various embodiments have been illustrated and described, it will be apparent to those skilled in the art in light of the present disclosure that various changes and modifications may be made without departing from the spirit and scope of the invention as defined in the following claims.

What is claimed is:

1. A data receiving circuit comprising:
a variable delay circuit suitable for generating a delayed strobe signal by delaying a strobe signal;
a receiving circuit suitable for sampling data in synchronization with the delayed strobe signal;
a frequency multiplier circuit suitable for receiving the delayed strobe signal, and generating a high-frequency strobe signal having a frequency twice as high as that of the delayed strobe signal;
a sampling circuit suitable for sampling the high-frequency strobe signal in synchronization with the data; and
a delay adjusting circuit suitable for adjusting a delay value of the variable delay circuit in response to the sampling result of the sampling circuit.

2. The data receiving circuit of claim 1, wherein the frequency multiplier circuit comprises:
a phase shift circuit suitable for generating a shifted strobe signal by shifting a phase of the delayed strobe signal by 90 degrees; and
an XOR gate suitable for receiving, and performing an XOR operation on, the delayed strobe signal and the shifted strobe signal, and outputting the high-frequency strobe signal.

3. The data receiving circuit of claim 1, wherein the sampling circuit samples the high-frequency strobe signal at a rising edge and a falling edge of the data.

4. The data receiving circuit of claim 3, wherein the delay adjusting circuit decreases the delay value of the variable delay circuit when the sampling result of the sampling circuit indicates a high level, and increases the delay value of the variable delay circuit when the sampling result of the sampling circuit indicates a low level.

5. The data receiving circuit of claim 3, wherein the sampling circuit comprises a dual edge-type D flip-flop suitable for receiving the high-frequency strobe signal through an input terminal thereof, receiving the data through a clock terminal thereof, and outputting the sampling result through an output terminal thereof.

6. The data receiving circuit of claim 4, wherein the delay adjusting circuit updates the delay value of the variable delay circuit after a set time has elapsed from a rising or falling edge of the data.

* * * * *